United States Patent
Jeong et al.

(10) Patent No.: US 9,018,652 B2
(45) Date of Patent: Apr. 28, 2015

(54) LIGHT EMITTING DEVICE

(71) Applicant: LG Innotek Co., Ltd., Seoul (KR)

(72) Inventors: Jong Pil Jeong, Seoul (KR); Jung Hyun Hwang, Seoul (KR); Chong Cook Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/732,694

(22) Filed: Jan. 2, 2013

(65) Prior Publication Data
US 2013/0168711 A1 Jul. 4, 2013

(30) Foreign Application Priority Data
Jan. 3, 2012 (KR) .................. 10-2012-0000622

(51) Int. Cl.
| | | |
|---|---|---|
| *H01L 33/00* | (2010.01) | |
| *H01L 33/32* | (2010.01) | |
| H01L 33/04 | (2010.01) | |
| H01L 33/20 | (2010.01) | |
| H01L 33/38 | (2010.01) | |
| H01L 33/42 | (2010.01) | |
| H01L 33/44 | (2010.01) | |
| F21K 99/00 | (2010.01) | |
| F21Y 101/02 | (2006.01) | |

(52) U.S. Cl.
CPC .............. *H01L 33/32* (2013.01); *H01L 33/04* (2013.01); *H01L 33/20* (2013.01); *H01L 33/382* (2013.01); *H01L 33/42* (2013.01); *H01L 33/44* (2013.01); *F21K 9/135* (2013.01); *F21Y 2101/02* (2013.01); *H01L 2924/0002* (2013.01); *H01L 2224/48091* (2013.01)

(58) Field of Classification Search
CPC .................................. H01L 33/24; H01L 33/22
USPC .............................................. 257/94, E33.034
See application file for complete search history.

(56) References Cited

U.S. PATENT DOCUMENTS

| 7,692,182 | B2 * | 4/2010 | Bergmann et al. ............... 257/22 |
|---|---|---|---|
| 2002/0150135 | A1 * | 10/2002 | Naone et al. ...................... 372/45 |
| 2002/0179918 | A1 * | 12/2002 | Sung et al. ........................ 257/99 |
| 2006/0126688 | A1 * | 6/2006 | Kneissl ......................... 372/43.01 |
| 2008/0191195 | A1 * | 8/2008 | Tanizawa et al. ................ 257/14 |
| 2009/0110017 | A1 * | 4/2009 | Aihara .......................... 372/44.01 |
| 2011/0156068 | A1 * | 6/2011 | Kwon et al. ...................... 257/94 |
| 2014/0097442 | A1 * | 4/2014 | Fang et al. ........................ 257/76 |

* cited by examiner

*Primary Examiner* — Thao X Le
*Assistant Examiner* — Patricia Reddington
(74) *Attorney, Agent, or Firm* — Ked & Associates, LLP (57) ABSTRACT

Disclosed are a light emitting device, a method of manufacturing the same, a light emitting device package, and a lighting system. The light emitting device includes: a substrate; a first conductive semiconductor layer on the substrate; an active layer on the first conductive semiconductor layer; a second conductive semiconductor layer; and a nitride semiconductor layer having a refractive index less than a refractive index of the second conductive semiconductor layer on the second conductive semiconductor layer.

11 Claims, 6 Drawing Sheets

LIGHT EMITTING DEVICE

CROSS-REFERENCE TO RELATED APPLICATION

This application claims under 35 U.S.C. §119 to Korean Patent Application No. 10-2012-0000622, filed Jan. 3, 2012, which is hereby incorporated by reference in its entirety.

BACKGROUND

The embodiment relates to a light emitting device, a method of manufacturing the same, a light emitting device package, and a lighting system.

A light emitting device (LED) includes a p-n junction diode having a characteristic of converting electric energy into light energy. The p-n junction diode can be formed by combining group III-V elements of the periodic table. The LED may represent various colors by adjusting the compositional ratio of compound semiconductors.

When forward voltage is applied to the LED, electrons of an n layer are bonded with holes of a p layer, so that energy corresponding to an energy gap between a conduction band and a valance band may be generated. This energy is mainly realized as heat or light, and the LED emits the energy as the light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

In a GaN-based light emitting diode (LED) according to the related art, in order to improve light emitting efficiency, light efficiency is further improved through a design of an active layer, and then a work of improving extraction efficiency is performed so that optimization is achieved.

According to the relate art, a patterned sapphire substrate (PSS) using a pattern on a substrate is used at a lower portion of a light emitting device chip, and roughening is used at an upper portion of the light emitting device chip so that light extraction efficiency may be improved. However, according to the demand of a high output light emitting device, the improvement in the light extraction efficiency is required.

SUMMARY

The embodiment provides a light emitting device capable of improving light extraction efficiency, a method of manufacturing the same, a light emitting device package, and a lighting system.

The embodiment provides a light emitting device capable of increasing optical efficiency, a method of manufacturing the same, a light emitting device package, and a lighting system.

According to the embodiment, there is provided a light emitting device including: a substrate; a first conductive semiconductor layer on the substrate; an active layer on the first conductive semiconductor layer; a second conductive semiconductor layer on the active layer; and a nitride semiconductor layer having a refractive index less than a refractive index of the second conductive semiconductor layer on the second conductive semiconductor layer.

DETAILED DESCRIPTION OF THE EMBODIMENTS

Hereinafter, a light emitting device, a light emitting device package, and a lighting system according to the embodiment will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

Figure 1:
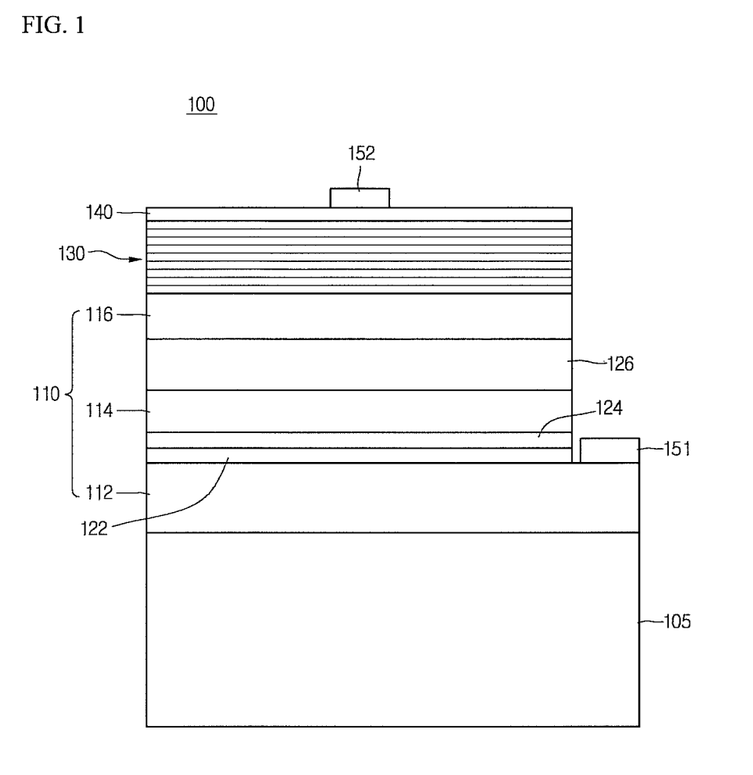
FIG. 1 is a sectional view illustrating a light emitting device according to a first embodiment.
Figure 2:
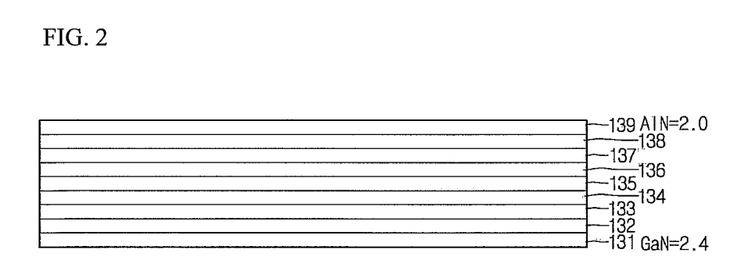
FIG. 2 is a partially enlarged view illustrating the light emitting device according to the first embodiment.

FIG. 1 is a sectional view illustrating a light emitting device 100 according to a first embodiment, and FIG. 2 is a partially enlarged view illustrating the light emitting device 130 according to the first embodiment.

The light emitting device 100 may include a substrate 105, a first conductive semiconductor layer 112 on the substrate 150, an active layer 114 on the first conductive semiconductor layer 112, a second conductive semiconductor layer 112 on the active layer 114, and a nitride semiconductor layer 130 having a refractive index less than that of the second conductive semiconductor layer 116 on the second conductive semiconductor layer 116.

The nitride semiconductor layer 130 may include $Al_xGa_{1-x}N$ ($0 \leq x \leq 1$).

The embodiment provides a light emitting device, a method of manufacturing the same, a light emitting package, and a lighting system capable of improving light extraction efficiency.

The embodiment provides a light emitting device, a method of manufacturing the same, a light emitting package, and a lighting system capable of improving optical efficiency.

To accomplish the above object, a material having a low refractive index is grown in-situ during the growth of a light emitting diode (LED) to improve the light extraction efficiency.

For example, the refractive index n of the nitride semiconductor layer 130 may become gradually reduced from the active layer 114 to the second conductive semiconductor layer 116.

The nitride semiconductor layer 130 may make contact with the second conductive semiconductor layer 116.

The embodiment may control the refractive index of the nitride semiconductor layer by controlling a composition of Al contained in the nitride semiconductor layer 130. For example, the composition x of Al contained in the nitride semiconductor layer 130 may become gradually increased from the active layer 114 to the second conductive semiconductor layer 116.

Accordingly, the refractive index n of the nitride semiconductor layer 130 may become gradually reduce from the active layer 114 to the second conductive semiconductor layer 116 so that the light extraction efficiency of the light emitted from the active layer 114 may be increased in the upward direction rather than the lateral direction.

The nitride semiconductor layer 130 may include a first nitride semiconductor layer 131, a second nitride semiconductor layer 132, a third nitride semiconductor layer 133, a fourth nitride semiconductor layer 134, a fifth nitride semiconductor layer 135, a sixth nitride semiconductor layer 136, a seventh nitride semiconductor layer 137, an eighth nitride semiconductor layer 138, and a ninth nitride semiconductor layer 139, the first nitride semiconductor layer 131 may include GaN, and the ninth nitride semiconductor layer 139 may include AlN, but the embodiment is not limited thereto.

Accordingly, the refractive index n of the nitride semiconductor layer 130 may become gradually reduced from the active layer 114 to the second conductive semiconductor layer 116 from about 2.4 to about 2.0, but the embodiment is not limited thereto.

According to the embodiment, the nitride semiconductor layer 130 may include an n type nitride semiconductor layer doped with n type dopant. For example, the nitride semiconductor layer 130 may be doped with Si, but the embodiment is not limited thereto.

Since the nitride semiconductor layer 130 is doped with an n type dopant, even if a second electrode 152 is formed on the nitride semiconductor layer 130 without making contact with the second conductive semiconductor layer 116, a carrier may be easily injected.

The nitride semiconductor layer 130 may have a thickness sufficient for enabling the tunneling of a carrier, but the embodiment is not limited thereto.

The embodiment may further include a transmissive ohmic layer 140 having a refractive index less than that of the nitride semiconductor layer 130 on the nitride semiconductor layer 130. The second electrode 152 may be formed on the transmissive ohmic layer 140.

A horizontal width of the first transmissive ohmic layer 140 may be substantially the same as a horizontal width of the nitride semiconductor layer 130 so that uniform current spreading may be achieved at the nitride semiconductor layer 130. Meanwhile, the horizontal width of the first transmissive ohmic layer 140 may be less than the horizontal width of the nitride semiconductor layer 130.

The transmissive ohmic layer 140 may have a single or multi-layer structure of metal oxide capable of facilitating the carrier injection. The transmissive ohmic layer 140 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, and the embodiment is not limited thereto.

Accordingly, the refractive index n of the nitride semiconductor layer 130 may become gradually reduced from the active layer 114 to the second conductive semiconductor layer 116 from about 2.4 to about 2.0.

Since the refractive index is controlled from about 2.0 to about over 1.0 in the transmissive ohmic layer 140, the refractive index becomes gradually reduced in the direction of the second conductive semiconductor layer 116, the nitride semiconductor layer 130, and the transmissive ohmic layer 140 so that light emitted from the active layer 114 may be efficiently extracted in the upward direction L2.

Figure 3:
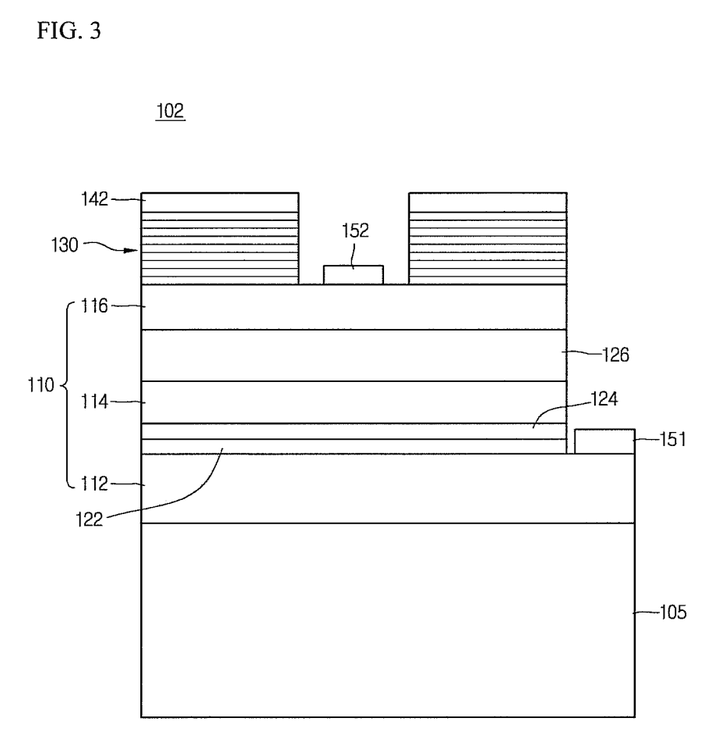
FIG. 3 is a sectional view illustrating a light emitting device according to a second embodiment.

FIG. 3 is a sectional view illustrating a light emitting device 102 according to a second embodiment.

The second embodiment may adopt the technical features and effects of the first embodiment.

According to the second embodiment, the second electrode 152 may make contact with the second conductive semiconductor layer 116 through the nitride semiconductor layer 130.

According to the second embodiment, there is no limitation in the thickness of the nitride semiconductor layer 130 for the tunneling of the carrier.

According to the second embodiment, the nitride semiconductor layer 130 may include a p type nitride semiconductor layer doped with a p type element. For example, after formation of the second conductive semiconductor layer 116, the nitride semiconductor layer 130 including a P type nitride semiconductor layer doped with a p type element may be formed in-situ.

The nitride semiconductor layer 130 may include an undoped nitride semiconductor layer which is not doped with an element. Upon the formation of the nitride semiconductor layer 130, a process may be performed without doping an n or p type conductive element to form the nitride semiconductor layer 130 including the undoped nitride semiconductor layer.

The second embodiment may further include a transparent insulating layer having a refractive index less than that of the nitride semiconductor layer 130 on the nitride semiconductor layer 130.

The transparent insulating layer 142 may include silicon oxide or silicon nitride, but the embodiment is not limited thereto.

According to the second embodiment, the refractive index n of the nitride semiconductor layer 130 may become gradually reduced from the active layer 114 to the second conductive semiconductor layer 116 from about 2.4 to about 2.0, and the refractive index becomes gradually reduced in the direction of the second conductive semiconductor layer 116, the nitride semiconductor layer 130, and the transparent insulating layer 142 by controlling the refractive index of the transparent insulating layer 142 from about 2.0 to about over 1.0 so that light emitted from the active layer 114 may be more efficiently extracted in the upward direction rather than the lateral direction.

Figure 4:
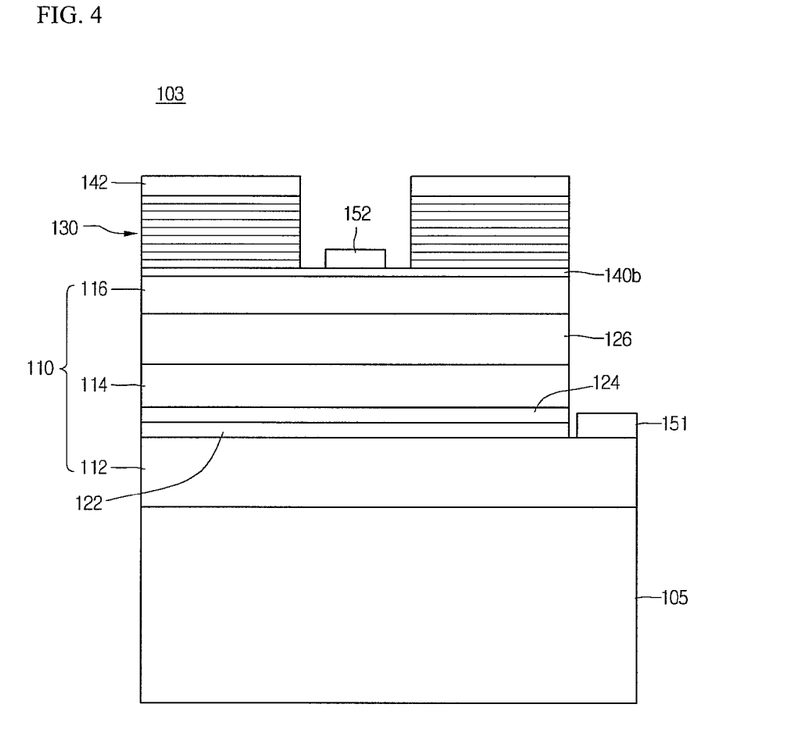
FIG. 4 is a sectional view illustrating a light emitting device according to a third embodiment.

FIG. 4 is a sectional view illustrating a light emitting device 103 according to a third embodiment.

The third embodiment may adopt the technical features and effects of the first embodiment and the second embodiment.

The third embodiment may further include a second transmissive ohmic layer 140b between the second conductive semiconductor layer 116 and the nitride semiconductor layer 130.

The second transmissive ohmic layer 140b has a refractive index between the refractive index of the second conductive layer 116 and the refractive index of the nitride semiconductor layer 130 so that light extraction efficiency may be maximized.

The second electrode 152 formed above the second conductive semiconductor layer 116 may be formed on the second transmissive ohmic layer 140b.

Reference numerals which are not described in FIGS. 1 to 4 will be illustrated in a following manufacturing method.

According to the embodiment, spreading of light may be improved and the embodiment is easily applied to a product by controlling the content (%) of Al.

According to the light device, the method of manufacturing the same, the light emitting device package, and the lighting system of the embodiment, light extraction efficiency can be increased. Further, according to the embodiment, optical efficiency can be increased.

Hereinafter, a method of manufacturing the light emitting device will be described with reference to FIGS. 5 to 8.

Figure 5:
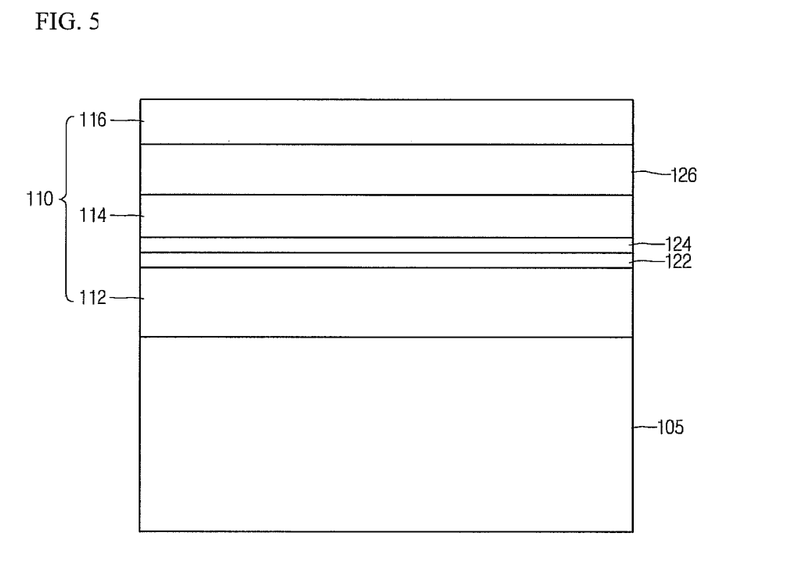
FIGS. 5 to 8 are sectional views illustrating a manufacturing process of the light emitting device according to the embodiment.

First, the substrate 105 as shown in FIG. 5 may be prepared. The substrate 105 may include a conductive substrate or an insulating substrate. For instance, the substrate 110 may include at least one of $Al_2O_3$, SiC, Si, GaAs, GaN, ZnO, GaP, InP, Ge, and $Ga_2O_3$. A concave-convex structure can be formed on the substrate 105, but the embodiment is not limited thereto.

The substrate 105 can be subject to the wet cleaning to remove impurities from the surface of the substrate 105.

A light extraction structure, for example, a PSS (not shown) may be formed on the substrate 105, but the embodiment is not limited thereto.

Then, the light emitting structure 110 including the first conductive semiconductor layer 112, the active layer 114 and the second semiconductor layer 116 may be foamed on the substrate 105.

A buffer layer (not shown) may be formed on the substrate 105. A buffer layer (not shown) may be formed on the substrate 105. The buffer layer may attenuate lattice mismatch between the light emitting structure 110 and the substrate 110. The buffer layer may include the group III-V compound semiconductor. For instance, the buffer layer may include at least one of GaN, InN, AlN, InGaN, AlGaN, InAlGaN, and AlInN.

An undoped semiconductor layer (not shown) may be formed on the buffer layer, but the embodiment is not limited thereto.

A first conductive layer 112 may be formed on the substrate 105 or the semiconductor layer.

The first conductive semiconductor layer 112 may include a group III-V compound semiconductor doped with a first conductive dopant. If the first conductive semiconductor layer 112 is an N type semiconductor layer, the first conductive dopant is an N type dopant, such as Si, Ge, Sn, Se, or Te, but the embodiment is not limited thereto.

The first conductive semiconductor layer 122 may include semiconductor material having the compositional formula of $In_xAl_yGa_{1-x-y}N$ ($0 \leq x \leq 1$, $0 \leq y \leq 1$, $0 \leq x+y \leq 1$).

The first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 112 may include an N type GaN layer, which is formed through the CVD, MBE, sputtering or HYPE. In addition, the first conductive semiconductor layer 112 may be formed by injecting trimethyl gallium (TMGa) gas, ammonia ($NH_3$) gas, nitrogen ($N_2$) gas and silane ($SiH_4$) gas including n type impurities, such as silicon, into the chamber.

Next, a current spreading layer 122 may be formed on the first conductive semiconductor layer 112. The current spreading layer 122 may be an undoped GaN layer, but the embodiment is not limited thereto.

After that, according to the embodiment, an electron injection layer 124 may be formed on the current spreading layer 122. The electron injection layer 124 may be a first conductive GaN layer. Electrons may be effectively injected into the electron injection layer 124 by doping the electron injection layer 124 with an N type doping element at a concentration of $6.0 \times 10^{18}$ atoms/$cm^3$~$8.0 \times 10^{18}$ atoms/$cm^3$.

According to the embodiment, a strain control layer (not shown) may be formed on the electron injection layer 124. For example, a strain control layer including $In_yAl_xGa_{(1-x-y)}N$($0 \leq x \leq 1$, $0 \leq y \leq 1$)/GaN may be formed on the electron injection layer 124.

The strain control layer may efficiently attenuate the stress resulting from lattice mismatch between the first conductive semiconductor layer 112 and the active layer 114.

Since the strain control layer is repeatedly laminated in at least 6 periods having the compositional formula of a first $In_{x1}GaN$ and a second $In_{x2}GaN$, more electrons are collected at a low energy level of the active layer 114 so that a recombination probability of electrons and holes is increased, thereby improving light emission efficiency.

After that, the active layer 114 may be formed on the first conductive semiconductor layer 112.

The active layer 114 may include at least one of a single quantum well structure, a multiple quantum well (MQW) structure, a quantum wire structure and a quantum dot structure. For instance, the active layer 114 can be formed with the MQW structure by injecting TMGa gas, $NH_3$ gas, $N_2$ gas, and trimethyl indium (TMIn) gas, but the embodiment is not limited thereto.

The active layer 114 may have a well/barrier layer including at least one of InGaN/GaN, InGaN/InGaN, AlGaN/GaN, InAlGaN/GaN, GaAs/AlGaAs (InGaAs) and GaP/AlGaP (InGaP), but the embodiment is not limited thereto. The well layer may include material having the bandgap energy lower than that of the barrier layer.

According to the embodiment, an electron blocking layer 126 may be formed on the active layer 114 for the purpose of electron blocking and MQW cladding of an active layer so that light emitting efficiency may be improved. For example, the electron blocking layer 126 may include an $Al_xIn_yGa_{(1-x-y)}N$($0 \leq x \leq 1, 0 \leq y \leq 1$)-based semiconductor having the energy bandgap higher than that of the active layer 114. The electron blocking layer 126 may have a thickness in the range of about 100 Å to about 600 Å, but the embodiment is not limited thereto.

The electron blocking layer 126 may have an $Al_zGa_{(1-z)}N$/GaN($0 \leq z \leq 1$) super lattice, but the embodiment is not limited thereto.

A p type ion may be implanted into the electron blocking layer 126 to efficiently block overflow electrons and increase injection efficiency of holes. An Mg ion is implanted into the electron blocking layer 126 at the concentration in the range of about $10^{180}$/$cm^3$ to about $10^{20}$/$cm^3$ to efficiently block overflow electrons and increase injection efficiency of holes.

Next, a second conductive semiconductor layer 116 may be formed on the electron blocking layer 126.

The second conductive semiconductor layer 116 may include the group III-V compound semiconductor doped with the second conductive dopant. For instance, the second conductive semiconductor layer 116 may include the semiconductor material having the compositional formula of $In_xAl_yGa_{1-x-y}N$ ($0 \leq x \leq 1$, $0 \leq y \leq 1$, $0 < x+y < 1$). In detail, the second conductive semiconductor layer 126 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 126 is a P type semiconductor layer, the second conductive dopant includes the P type dopant such as Mg, Zn, Ca, Sr, or Ba. The second conductive semiconductor layer 126 can be prepared as a single layer or a multiple layer, but the embodiment is not limited thereto.

The second conductive semiconductor layer 116 may include a p type GaN layer, which can be formed by injecting TMGa gas, $NH_3$ gas, $N_2$ gas and $(EtCp_2Mg)\{Mg(C_2H_5C_5H_4)_2\}$ gas including p type impurities (for example, Mg) into the chamber, but the embodiment is not limited thereto.

According to the embodiment, the first conductive semiconductor layer 112 may include an N type semiconductor layer and the second conductive semiconductor layer 126 may include a P type semiconductor layer, but the embodiment is not limited thereto. In addition, a semiconductor layer, such as an N type semiconductor layer (not shown) having polarity opposite to that of the second conductive semiconductor layer 126, can be formed on the second conductive semiconductor layer 126. Thus, the light emitting structure 110 may include one of an N—P junction structure, a P—N junction structure, an N—P—N junction structure, and a P—N—P junction structure.

Figure 6:
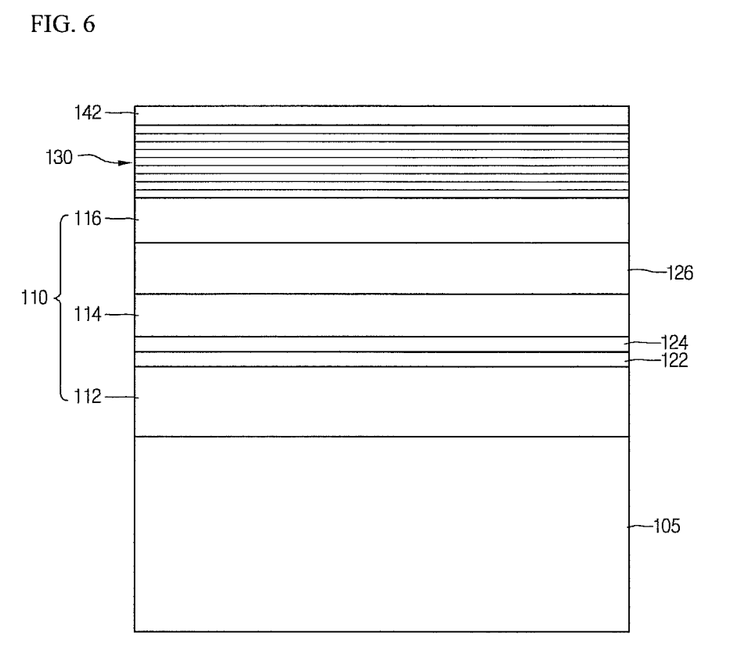

Thereafter, as shown in FIG. 6, a nitride semiconductor layer 130 having a refractive index less than that of the second conductive semiconductor layer 116 is formed on the second conductive semiconductor layer 116. The nitride semiconductor layer 130 may include $Al_xGa_{1-x}N$ ($0 \leq x \leq 1$).

Light extraction efficiency may be improved by growing a material of a low refractive index in-situ during the growth of a light emitting diode (LED). For example, the refractive index n of the nitride semiconductor layer 130 may become gradually reduced from the active layer 114 to the second conductive semiconductor layer 116.

The embodiment may control the refractive index of the nitride semiconductor layer by controlling a composition of Al contained in the nitride semiconductor layer 130. For example, the composition x of Al contained in the nitride semiconductor layer 130 may become gradually increased from the active layer 114 to the second conductive semiconductor layer 116.

Accordingly, the refractive index n of the nitride semiconductor layer 130 may become gradually reduce from the active layer 114 to the second conductive semiconductor layer 116 so that light emitted from the active layer 114 may increase light extraction efficiency in the upward direction rather than the lateral direction.

For example, the refractive index n of the nitride semiconductor layer 130 may become gradually reduced from the active layer 114 to the second conductive semiconductor layer 116 from about 2.4 to about 2.0, but the embodiment is not limited thereto.

According to the embodiment, the nitride semiconductor layer 130 may include an N type nitride semiconductor layer doped with an N type dopant. For example, the nitride semiconductor layer 130 may be doped with Si, but the embodiment is not limited thereto.

Since the nitride semiconductor layer 130 is doped with an N type dopant, even if a second electrode 152 is formed on the nitride semiconductor layer 130 without making contact with the second conductive semiconductor layer 116, a carrier may be easily injected.

The nitride semiconductor layer 130 may have a thickness sufficient for enabling the tunneling of a carrier, but the embodiment is not limited thereto.

As shown in FIG. 1, the first embodiment may further include a transmissive ohmic layer 140 having a refractive index less than that of the nitride semiconductor layer 130 on the nitride semiconductor layer 130. The second electrode 152 may be formed on the transmissive ohmic layer 140. The transmissive ohmic layer 140 may have a single or multi-layer structure of metal oxide capable of facilitating the carrier injection. The transmissive ohmic layer 140 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, and the embodiment is not limited thereto.

Accordingly, the refractive index n of the nitride semiconductor layer 130 may become gradually reduced from the active layer 114 to the second conductive semiconductor layer 116 from about 2.4 to about 2.0. Since the refractive index is controlled from about 2.0 to about over 1.0 in the transmissive ohmic layer 140, the refractive index becomes gradually reduced in the direction of the second conductive semiconductor layer 116, the nitride semiconductor layer 130, and the transmissive ohmic layer 140 so that light emitted from the active layer 114 may be efficiently extracted in the upward direction L2.

As shown in FIG. 6, the second embodiment may further include a transparent insulating layer 142 having a refractive index less than that of the nitride semiconductor layer 130 on the nitride semiconductor layer. The transparent insulating layer 142 may include silicon oxide or silicon nitride, but the embodiment is not limited thereto.

According to the second embodiment, the refractive index n of the nitride semiconductor layer 130 may become gradually reduced from the active layer 114 to the second conductive semiconductor layer 116 from about 2.4 to about 2.0. Since the refractive index is controlled from about 2.0 to about over 1.0 in the transmissive ohmic layer 140, the refractive index becomes gradually reduced in the direction of the second conductive semiconductor layer 116, the nitride semiconductor layer 130, and the transmissive ohmic layer 140 so that light emitted from the active layer 114 may be efficiently extracted in the upward direction L2.

According to the second embodiment, the second electrode 152 may make contact with the second conductive semiconductor layer 116 through the nitride semiconductor layer 130. According to the second embodiment, there is no limitation in the thickness of the nitride semiconductor layer 130 for the tunneling of the carrier.

As shown in FIG. 4, the third embodiment may further include a second transmissive ohmic layer 140b between the second conductive semiconductor layer 116 and the nitride semiconductor layer 130.

The second transmissive ohmic layer 140b has a refractive index between the refractive index of the second conductive layer 116 and the refractive index of the nitride semiconductor layer 130 so that light extraction efficiency may be maximized.

According to the embodiment, spreading of light may be improved and the embodiment is easily applied to a product by controlling the content (%) of Al.

Figure 7:
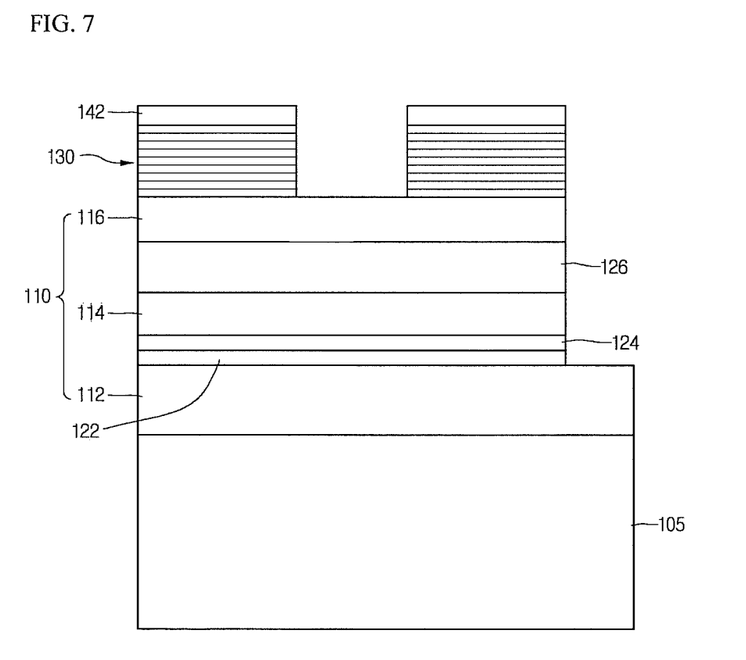

To this end, as shown in FIG. 7, according to the embodiment, the second conductive semiconductor layer 116 may be exposed by partially removing the transparent insulating layer 142 and the nitride semiconductor layer 130.

The first conductive semiconductor layer 112 may be exposed by partially removing the transparent insulating layer 142, the nitride semiconductor layer 130, the second conductive semiconductor layer, the electron blocking layer, a strain control layer, and the electron injection layer 124, and the current spreading layer 122.

Figure 8:
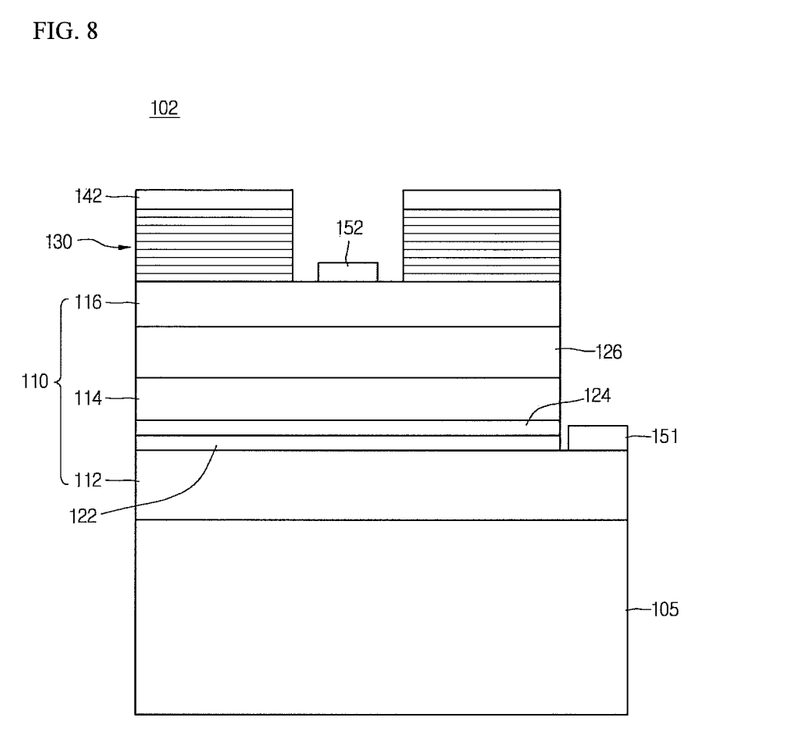

After that, as shown in FIG. 8, a second electrode 152 and a first electrode 151 may be formed on the second exposed conductive semiconductor layer 116 and the first exposed conductive semiconductor layer 112, respectively.

According to the light device, the method of manufacturing the same, the light emitting device package, and the lighting system of the embodiment, light extraction efficiency can be increased.

Further, according to the embodiment, optical efficiency can be increased.

Figure 9:
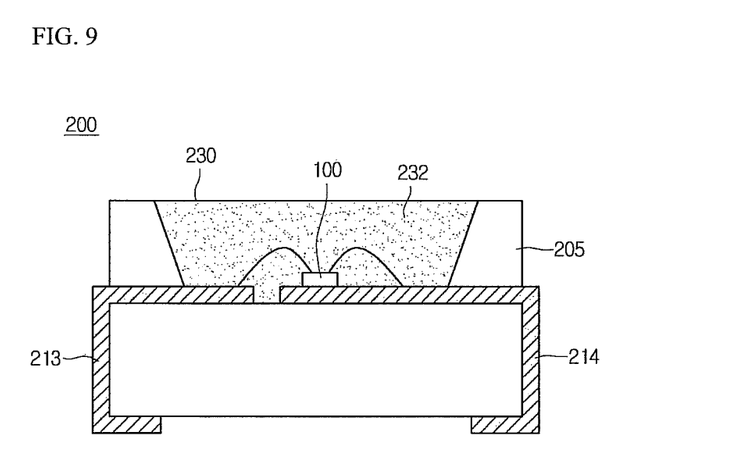
FIG. 9 is a sectional view illustrating a light emitting device package according to the embodiment.

FIG. 9 is a sectional view illustrating a light emitting device package 200 according to the embodiment.

The light emitting device package 200 according to the embodiment includes a package body 205, third and fourth electrode layers 213 and 214 formed on the package body 205, the light emitting device 100 provided on the package body 205 and electrically connected to the third and fourth electrode layers 213 and 214, and a molding member 240 that surrounds the light emitting device 100.

The package body 205 may include silicon, synthetic resin or metallic material. An inclined surface may be formed around the light emitting device 100.

The third and fourth electrode layers 213 and 214 may be electrically isolated from each other to supply power to the light emitting device 100. In addition, the third and fourth electrode layers 213 and 214 reflect the light emitted from the light emitting device 100 to improve the light efficiency and dissipate heat generated from the light emitting device 100 to the outside.

The lateral type light emitting device shown in FIG. 1, 3, or 4 can be employed as the light emitting device 100, but the embodiment is not limited thereto.

The light emitting device 100 may be installed on the package body 205 or the third and fourth electrode layers 213 and 214.

The light emitting device 100 is electrically connected to the third electrode layer 213 and/or the fourth electrode layer 214 through at least one of a wire bonding scheme, a flip chip bonding scheme and a die bonding scheme. According to the embodiment, the light emitting device 100 is electrically connected to the third electrode layer 213 through a wire and electrically connected to the fourth electrode layer 214 through the die bonding scheme, but the embodiment is not limited thereto.

The molding member 230 surrounds the light emitting device 100 to protect the light emitting device 100. In addition, the molding member 230 may include phosphors to change the wavelength of the light emitted from the light emitting device 100.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 10:
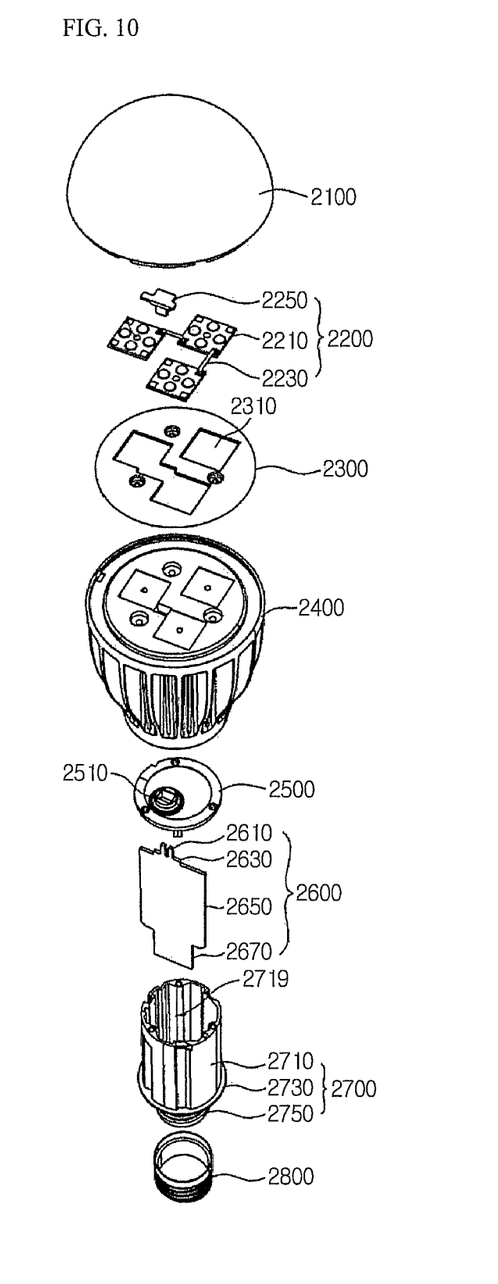
FIG. 10 is an exploded perspective view an example of a lighting system including the light emitting device according to the embodiment.

FIG. 10 is an exploded perspective view an example of a lighting system including the light emitting device according to the embodiment.

As shown in FIG. 10, the lighting system according to the embodiment may include a cover 2100, a light source module 2200, a radiator 2400, a power supply part 2600, an inner case 2700, and a socket 2800. The lighting system according to the embodiment may further include at least one of a member 2300 and a holder 2500. The light source module 2200 may include the light emitting device 100 or the light emitting device module 200 according to the embodiment.

For example, the cover 2100 may have a blub shape, a hemisphere shape, a partially-open hollow shape. The cover 2100 may be optically coupled with the light source module 2200. For example, the cover 2100 may diffuse, scatter, or excite light provided from the light source module. The cover 2100 may be a type of optical member. The cover 2100 may be coupled with the radiator 2400. The cover 2100 may include a coupling part which is coupled with the radiator 2400.

The cover 2100 may include an inner surface coated with a milk-white paint. The milk-white paint may include a diffusion material to diffuse light. The cover 2100 may have the inner surface of which surface roughness is greater than that of the outer surface thereof. The surface roughness is provided for the purpose of sufficiently scattering and diffusing the light from the light source module 2200.

For example, a material of the cover 2100 may include glass, plastic, polypropylene (PP), polyethylene (PE), and polycarbonate (PC). The polycarbonate (PC) has the superior light resistance, heat resistance and strength among the above materials. The cover 2100 may be transparent so that a user may view the light source module 2200 from the outside, or opaque. The cover 2100 may be formed through a blow molding scheme.

The light source module 220 may be disposed at one surface of the radiator 2400. Accordingly, the heat from the light source module 220 is transferred to the radiator 2400. The light source module 2200 may include a light source 2210, a connection plate 2230, and a connector 2250.

The member 2300 is disposed at a top surface of the radiator 2400, and includes guide grooves 2310 into which a plurality of light sources 2210 and the connector 2250 are inserted. The guide grooves 2310 correspond to a substrate of the light source 2210 and the connector 2250.

A surface of the member 2300 may be coated with a light reflective material. For example, the surface of the member 2300 may be coated with white paint. The member 2300 again reflects light, which is reflected by the inner surface of the cover 2100 and is returned to the direction of the light source module 2200, to the direction of the cover 2100. Accordingly, the light efficiency of the lighting system according to the embodiment may be improved.

For example, the member 2300 may include an insulating material. The connection plate 2230 of the light source module 2200 may include an electrically conductive material. Accordingly, the radiator 2400 may be electrically connected to the connection plate 2230. The member 2300 may be configured by an insulating material, thereby preventing the connection plate 2230 from being electrically shorted with the radiator 2400. The radiator 2400 receives heat from the light source module 2200 and the power supply part 2600 and radiates the heat.

The holder 2500 covers a receiving groove 2719 of an insulating part 2710 of an inner case 2700. Accordingly, the power supply part 2600 received in the insulating part 2710 of the inner case 2700 is closed. The holder 2500 includes a guide protrusion 2510. The guide protrusion 2510 has a hole through a protrusion of the power supply part 2600.

The power supply part 2600 processes or converts an electric signal received from the outside and provides the processed or converted electric signal to the light source module 2200. The power supply part 2600 is received in the receiving groove of the inner case 2700, and is closed inside the inner case 2700 by the holder 2500.

The power supply part 2600 may include a protrusion 2610, a guide part 2630, a base 2650, and an extension part 2670.

The guide part 2630 has a shape protruding from one side of the base 2650 to the outside. The guide part 2630 may be inserted into the holder 2500. A plurality of components may be disposed above one surface of the base 2650. For example, the components may include a DC converter converting AC power provided from an external power supply into DC power, a driving chip controlling driving of the light source module 2200, and an electrostatic discharge (ESD) protection device protecting the light source module 2200, but the embodiment is not limited thereto.

The extension part 2670 has a shape protruding from an opposite side of the base 2650 to the outside. The extension part 2670 is inserted into an inside of the connection part 2750 of the inner case 2700, and receives an electric signal from the outside. For example, a width of the extension part 2670 may be smaller than or equal to a width of the connection part 2750 of the inner case 2700. First terminals of a "+ electric wire" and a "− electric wire" are electrically connected to the extension part 2670 and second terminals of the "+ electric wire" and the "− electric wire" may be electrically connected to a socket 2800.

The inner case 2700 may include a molding part therein together with the power supply part 2600. The molding part is prepared by hardening molding liquid, and the power supply part 2600 may be fixed inside the inner case 2700 by the molding part.

According to the light emitting device, the method of manufacturing the same, the light emitting package, and the lighting system of the embodiment, the light extraction efficiency can be increased.

In addition, according to the embodiment, the optical efficiency can be increased.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a substrate;
a first conductive semiconductor layer on the substrate;
an active layer on the first conductive semiconductor layer;
a second conductive semiconductor layer on the active layer; and
a nitride semiconductor layer having a refractive index less than a refractive index of the second conductive semiconductor layer on a top surface of the second conductive semiconductor layer,
wherein the nitride semiconductor layer includes an n type nitride semiconductor layer,
wherein the n type nitride semiconductor layer has a thickness sufficient for enabling tunneling, and
wherein the refractive index of the nitride semiconductor layer becomes gradually reduced as the nitride semiconductor layer is located away from the second conductive semiconductor layer.

2. The light emitting device of claim 1, wherein the refractive index of the nitride semiconductor layer becomes gradually reduced in a direction from the active layer to the second conductive semiconductor layer.

3. The light emitting device of claim 1, wherein the refractive index of the nitride semiconductor layer at a region close to the second conductive semiconductor layer is higher than the refractive index of the nitride semiconductor layer at a region away from the second conductive semiconductor layer.

4. The light emitting device of any one of claim 1, wherein the nitride semiconductor layer comprises an $Al_xGa_{1-x}N$ layer ($0 \leq x \leq 1$).

5. The light emitting device of claim 4, wherein a composition of Al in the nitride semiconductor layer becomes gradually increased as the nitride semiconductor layer is located away from the second conductive semiconductor layer.

6. The light emitting device of claim 4, wherein a composition of Al in the nitride semiconductor layer at a region close to the second conductive semiconductor layer is less than the composition of Al in the nitride semiconductor layer at a region away from the second conductive semiconductor layer.

7. The light emitting device of claim 1, wherein the nitride semiconductor layer contacts the second conductive semiconductor layer.

8. The light emitting device of claim 1, wherein the nitride semiconductor layer includes at least a first layer, a second layer on the first layer, and a third layer on the second layer, and
wherein the refractive index of the nitride semiconductor layer is decreased by a step graded increment in an order from the first layer of the nitride semiconductor layer to a last layer of the nitride semiconductor layer.

9. The light emitting device of claim 1, wherein the refractive index of the nitride semiconductor layer becomes continuously reduced as the nitride semiconductor layer is located away from the second conductive semiconductor layer.

10. The light emitting device of claim 7, wherein an undermost surface of the nitride semiconductor layer contacts an uppermost surface of the second conductive semiconductor layer.

11. The light emitting device of claim 1, wherein the refractive index of the nitride semiconductor layer is in an approximate range between 2.0 and 2.4.

* * * * *